United States Patent
Miller et al.

(10) Patent No.: US 10,847,419 B2
(45) Date of Patent: Nov. 24, 2020

(54) STRESS COMPENSATION AND RELIEF IN BONDED WAFERS

(71) Applicant: RAYTHEON COMPANY, Waltham, MA (US)

(72) Inventors: Scott S. Miller, Waltham, MA (US); Christine Frandsen, Waltham, MA (US); Andrew Cahill, Waltham, MA (US); Sean P. Kilcoyne, Waltham, MA (US); Shannon Wilkey, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/920,983

(22) Filed: Mar. 14, 2018

(65) Prior Publication Data

US 2019/0287854 A1    Sep. 19, 2019

(51) Int. Cl.
| | |
|---|---|
| *H01L 21/78* | (2006.01) |
| *H01L 21/683* | (2006.01) |
| *H01L 23/00* | (2006.01) |
| *H01L 21/66* | (2006.01) |

(52) U.S. Cl.
CPC .............. *H01L 21/78* (2013.01); *H01L 22/20* (2013.01); *H01L 23/562* (2013.01); *H01L 21/6835* (2013.01); *H01L 22/12* (2013.01)

(58) Field of Classification Search
CPC ....... H01L 21/78; H01L 22/20; H01L 23/562; H01L 21/6835; H01L 22/12
See application file for complete search history.

(56) References Cited

U.S. PATENT DOCUMENTS

| | | | |
|---|---|---|---|
| 6,865,308 B1 | 3/2005 | Conway et al. | |
| 6,902,987 B1 | 6/2005 | Tong et al. | |
| 7,335,088 B1* | 2/2008 | Hwang | .................. B24B 37/30 |
| | | | 451/287 |
| 8,216,945 B2 | 7/2012 | Prins et al. | |
| 2004/0079633 A1* | 4/2004 | Cheung | ............... H01L 21/6723 |
| | | | 204/242 |
| 2010/0102435 A1* | 4/2010 | Ryan | ..................... H01L 23/562 |
| | | | 257/692 |

(Continued)

FOREIGN PATENT DOCUMENTS

JP    H08330882 A    12/1996

OTHER PUBLICATIONS

ISR/WO from related PCT Application No. PCT/US2018/060791 dated Mar. 1, 2019.

*Primary Examiner* — Edward Chin
(74) *Attorney, Agent, or Firm* — Burns & Levinson, LLP; Joseph M. Maraia

(57) ABSTRACT

Disclosed is a process for manufacturing individual die devices, with a desired or predicted amount of flatness, from a bonded wafer process. The flatness of a bonded wafer is measured at point in the wafer manufacturing process. This measurement is compared to a value predetermined by an empirical analysis of previous devices made by the same process. If the flatness of the bonded wafer is not at the predetermined value, then one or more compensation layers are provided to the bonded wafer to obtain the predetermined flatness value. Once obtained, subsequent processing is performed and the resulting individual dies are obtained with the desired flatness characteristic.

15 Claims, 5 Drawing Sheets

(56) References Cited

U.S. PATENT DOCUMENTS

| | | |
|---|---|---|
| 2013/0307372 A1 | 11/2013 | Ito |
| 2015/0235891 A1 | 8/2015 | Garant et al. |
| 2017/0063035 A1 | 3/2017 | Wang et al. |
| 2017/0162522 A1* | 6/2017 | Chang .................. C23C 16/402 |
| 2017/0178891 A1* | 6/2017 | Batinica ............ H01L 21/02002 |
| 2017/0200711 A1* | 7/2017 | Uzoh .................... H01L 25/105 |
| 2018/0294158 A1* | 10/2018 | Brawley ........... H01L 21/02238 |
| 2018/0342410 A1* | 11/2018 | Hooge .................... H01L 22/20 |

\* cited by examiner

STRESS COMPENSATION AND RELIEF IN BONDED WAFERS

GOVERNMENT LICENSE RIGHTS

This invention was made with Government support under SC15-00036 TO 0020/7 awarded by NASA. The Government has certain rights in the invention.

BACKGROUND

With improvements in transistor processing, higher frequencies of operation have become available. The functionality of these integrated circuits (ICs) has increased and a variety of silicon-based System-on-Chips (SOC) or a Sensor Chip Assembly/Array (SCA) have been demonstrated. These devices may be manufactured by bonding two wafers together to obtain this functionality. The bonded wafer device, however, can result in a bonded pair of wafers with high stress evident in the structure.

As is known, the bonded wafer device is diced to obtain individual dies. Disadvantageously, however, the stress in the bonded wafer device results in an individual die that has an unacceptable bowing parameter, that is, a die that is not sufficiently flat for the intended performance requirements.

What is needed, therefore, is a method for obtaining, from a bonded wafer device, individual dies that have an acceptable, i.e., a predetermined, flatness characteristic.

SUMMARY

According to one aspect of the disclosure, a method of manufacturing an individual die having a predetermined die bowing value from a bonded wafer using a wafer bonding process, the method comprises (a) bonding a first wafer to a second wafer to create an intermediate bonded structure; (b) measuring an amount of bowing of a first surface of the intermediate bonded structure; (c) applying a bowing compensation layer of material to a second surface of the intermediate bonded structure if a difference between the measured bowing amount and a target bowing value is not less than or equal to a predetermined threshold value; (d) repeating (b) and (c) until the difference is less than or equal to the predetermined threshold value; (e) performing additional steps of the wafer bonding process on the intermediate bonded structure to obtain the bonded wafer; and (f) dicing the bonded wafer apart to obtain the individual die having the predetermined die bowing value.

According to one aspect of the disclosure, a method of manufacturing an individual die, having a predetermined die bowing value, from a bonded wafer using a wafer bonding process comprises (a) bonding a first wafer to a second wafer to create an intermediate bonded structure; (b) retrieving, from a database, a target wafer bowing value that corresponds to the predetermined die bowing value; (c) measuring an amount of bowing of a first surface of the intermediate bonded structure; (d) comparing the measured bowing amount to the retrieved target wafer bowing value; (e) applying a bowing compensation layer of material to a second surface of the intermediate bonded structure if the measured bowing amount is not equal to the retrieved target bowing value; (f) repeating (c)-(e) until the measured bowing amount is within a predetermined threshold value of the retrieved target bowing value; (g) performing additional processing of the intermediate bonded structure to obtain the bonded wafer; and (h) dicing the bonded wafer apart to obtain the individual die having the predetermined die bowing value.

According to one aspect of the disclosure, a method of manufacturing a plurality of dies, each die having a predetermined die bowing value, comprises (a) bonding a first wafer to a second wafer to create an intermediate bonded wafer structure; (b) measuring an amount of bowing of a first surface of the intermediate bonded wafer structure; (c) applying a bowing compensation structure to a second surface of the intermediate bonded structure if a difference between the measured bowing amount and a target bowing value is not less than or equal to a predetermined threshold value; (d) repeating (b) and (c) until the difference is less than or equal to the predetermined threshold value; (e) performing additional processing steps on the intermediate bonded structure to obtain a bonded wafer structure; and (f) dicing the bonded wafer structure apart to obtain the plurality of individual dies.

BRIEF DESCRIPTION OF THE DRAWINGS

Various aspects of the disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Figure 1:
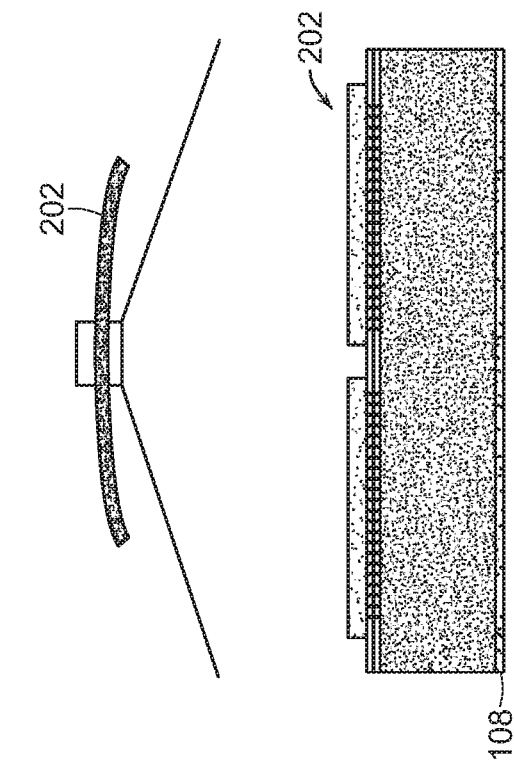
FIG. 1 represents a step in a known wafer bonding process.

In the following description, details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

It is to be understood that the disclosure is not limited in its application to the details of construction and the arrangement of the components set forth in the following description or illustrated in the drawings as it is capable of implementations or of being practiced or carried out in various ways. Also, it is to be understood that the phraseology and terminology employed herein are for the purpose of description only and should not be regarded as limiting.

Certain features that are, for clarity, described in the context of separate implementations, may also be provided in combination in a single implementation. Conversely, various features, which are, for brevity, described in the context of a single implementation, may also be provided separately or in any suitable sub-combination.

Generally, and as will be described in more detail below, aspects of the present disclosure provide for applying one or more stress compensation layers to the bonded wafer level at a predetermined point in the process in order to deliver individual dies with a predictable flatness value. Further, aspects of the present disclosure allow for rework/correction of a stress compensation layer prior to the dicing step. In other words, the stresses in a bonded wafer are adjusted to yield a desired bow, curvature or flatness characteristic of an individual die obtained after the dicing step. Advantageously, additional processing of individual dies is not needed in order to obtain the desired flatness.

In one approach, one or more stress compensation layers are added after the wafer bond step has been completed. Various types of films, such as Nitride (tensile) or Oxide (compressive) may be used.

It should be noted that bow, bowing, curve, curvature, flatness, convex, concave and the measuring thereof, are used interchangeably to refer to how flat a surface is.

In a known wafer bonding process, a first wafer 102 and a second wafer 104 are bonded to one another, per known techniques, as shown in FIG. 1. For explanatory purposes, an amount of relative bowing between the first wafer 102 and the second wafer 104 is exaggerated in the top portion of FIG. 1. A close-up view of the interface between the first wafer 102 and the second wafer 104 (the rectangular area) is presented in the lower portion of FIG. 1.

While the Figures may show each of the first wafer 102 and the second wafer 104 as single wafers, aspects of the present disclosure are not limited to such. An aspect of the present disclosure also includes a structure where one or both of the first wafer 102 and the second wafer 104 is a multi-wafer stack.

A first compensation layer 106 and a second compensation layer 108 are provided on the external surfaces of the first and second wafers 102, 104, respectively, prior to the wafer bonding process. These compensation layers 106, 108 are provided to give each of the first and second wafers 102, 104 some predetermined amount of bow or tension. Various types of films, such as Nitride (tensile) or Oxide (compressive), are known to be provided as either of the first or second compensation layers 106, 108. The first and second compensation layers 106, 108 are provided to give the first and second wafers 102, 104 respective amounts of stress, i.e., tension or compression, to compensate for the effects of bonding the two wafers together. In other words, the wafers are pre-stressed, to some extent, prior to being bonded to one another.

Figure 2:
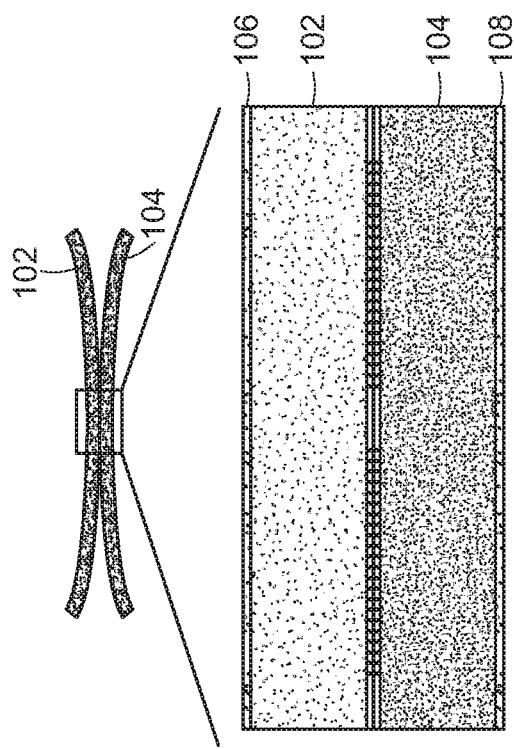
FIG. 2 represents a step in a known wafer bonding process.

Subsequently, i.e., after the two wafers are bonded together, a processed wafer pair structure 202 results, as shown in FIG. 2. The layout of FIG. 2 is similar to that described above with respect to FIG. 1. The structure 202 may have had additional processing, for example, the addition of devices or other structural changes such as the addition or removal of layers or material to or from the first and second wafers 102, 104. As a non-limiting example depicted in FIG. 2, the first compensation layer 106 has been removed by the additional processing of the structure 202.

Figure 3:
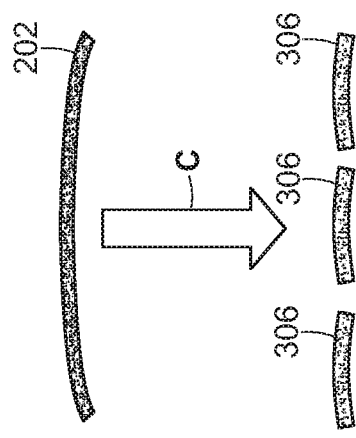
FIG. 3 represents a step in a known wafer bonding process.

Once the processing of the bonded wafers is complete, the dies on the bonded wafer pair structure 202 are delineated. Once delineated, the structure 202 is cut, i.e., diced apart, to obtain individual, i.e., singulated, dies 306. As shown in FIG. 3, the processed wafer pair structure 202 in the top portion progresses, represented by the arrow C, to the singulated dies 306 presented in the bottom portion.

Figure 4:
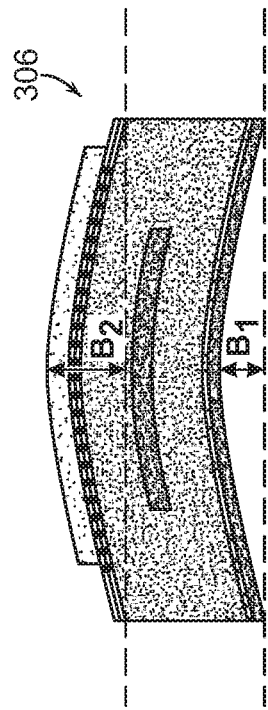
FIG. 4 represents a step in a known wafer bonding process.

In the known process, however, each die 306 has some amount of bowing, represented in FIG. 4 by the amounts $B_1$ and $B_2$. If the die 306 does not have the desired degree of flatness, or an acceptable amount of bowing, die level stress compensation layers may be added to each individual die 306. Applying these compensation layers to the die 306, however, involves the risk of damaging the die 306.

Various mechanical approaches or other compensation schemes have been implemented to "flatten" a die 306. In one known approach, the die 306 is vacuumed down to a level chuck for a predetermined amount of time in order to re-shape the die 306. In another approach, the die 306 is epoxied to a reference surface in order to obtain the desired degree of flatness. These approaches, however, are directed to fixing the flatness at the level of the individual die 306 and are expensive and time-consuming.

Advantageously, aspects of the present disclosure apply a stress compensation layer or layers to bonded wafers. These compensation layers are chosen in order to provide the bonded wafer structure with an amount of bowing that will result in an individual die with the desired amount of flatness. As will be described in more detail below, the bowing of the bonded wafers is set to a predetermined amount at a point in the process. Once set to that amount, subsequent processing of the bonded wafers, including the dicing step, will result in individual dies with the desired flatness.

Figure 5:
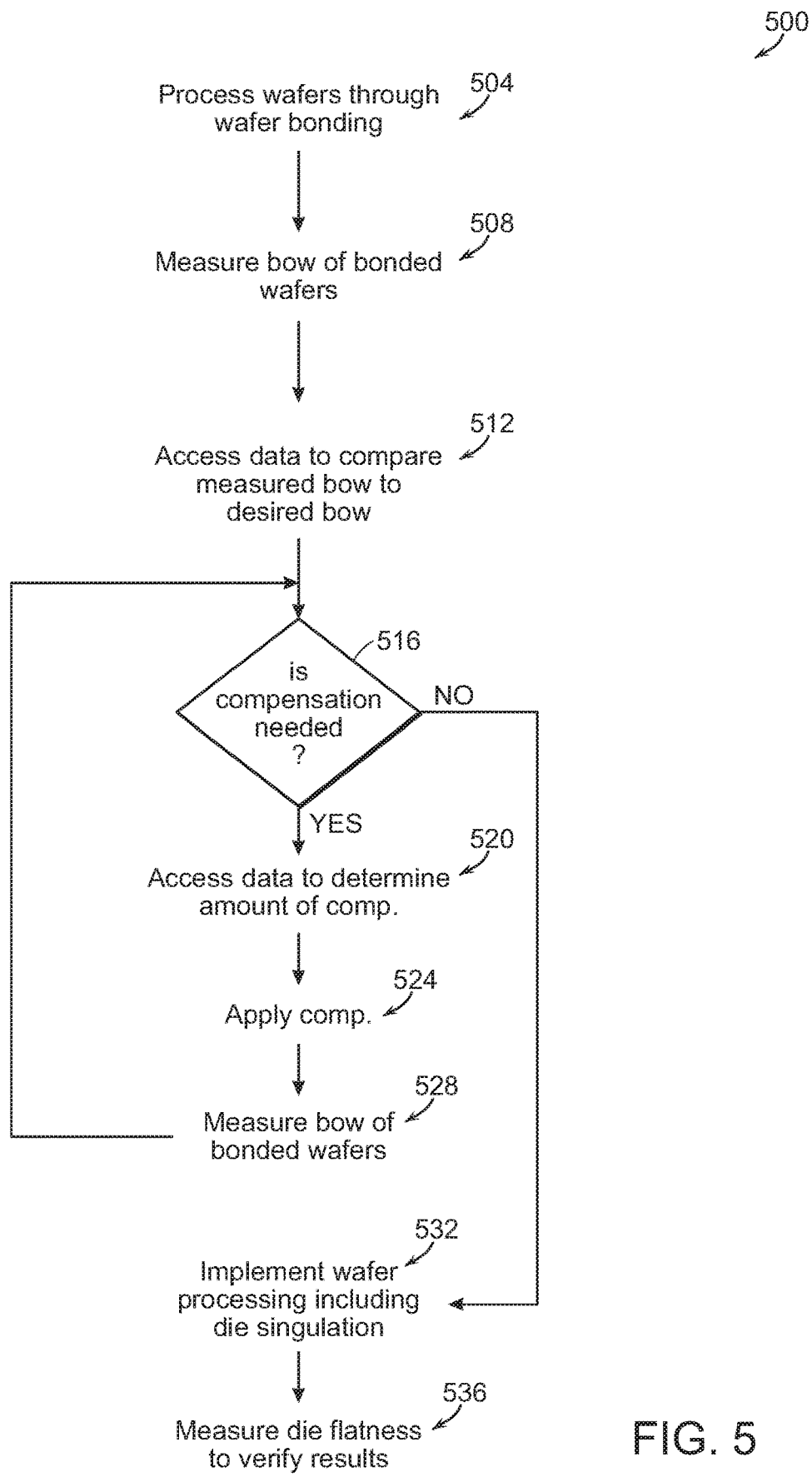
FIG. 5 is a method of providing individual dies, with a desired flatness, from a wafer bonding process in accordance with an aspect of the present disclosure.
Figure 6:
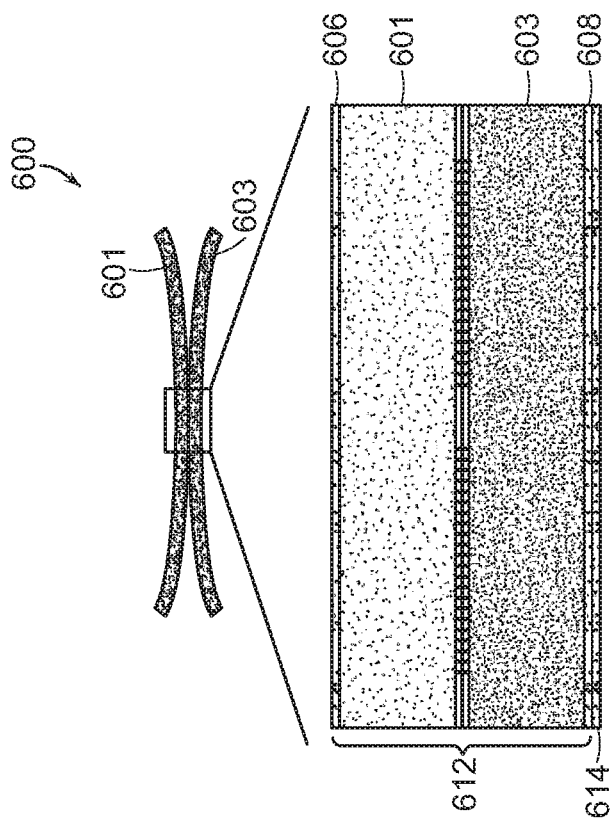
FIG. 6 represents a step in the processing of bonded wafers in accordance with the method of FIG. 5.

Referring now to FIG. 5, a method 500 of providing flatness correction or compensation, in accordance with an aspect of the present disclosure will now be described. At step 504, a bonded wafer device 600 is manufactured, per known techniques, by bonding a first wafer 601 to a second wafer 603, as shown in FIG. 6. Per known processes, as described above, a first compensation layer 606 and a second compensation layer 608 are provided on the external surfaces of the first and second wafers 601, 603, respectively, and, together with the bonded first and second wafers 601, 603 form an intermediate bonded substructure 612 as shown in the lower portion of FIG. 6 which is a close-up view of the interface between the first wafer 601 and the second wafer 603 (the rectangular area) presented in the top portion. For explanatory purposes, an amount of relative bowing between the first wafer 601 and the second wafer 604 is exaggerated in the top portion of FIG. 6.

At step 508, the amount of bowing or flatness of the intermediate bonded substructure 612 is measured using known metrology techniques and is expressed in micrometers ($\mu$m). This measurement of flatness is performed after the wafers 601, 603 have been bonded together and at a point in the process where flatness can be determined. As it is known that subsequent processing may make such a measurement difficult, the last such point in the manufacturing process where the measurement is accessible is chosen.

Thus, in one instance, the measurement is made after annealing. In another instance, the measurement is made after a grinding step but before chemical or mechanical polishing/planarization (CMP). Still further, in an example of manufacturing a detector, the measurement may be performed after a detector thinning process as measuring at this point may serve to mitigate detector face damage that may occur later in the process.

Over time and many previous cycles of the present process, that is, over a number of bonded wafers previously processed through the wafer system, a database of bowing values can be created. This database correlates the amount of bowing of the intermediate bonded structure 612 measured at this point in the process, i.e., at step 508, with a desired final bowing value of the individual die. Thus, if a specific die flatness value is desired, the database contains the bowing value that the intermediate bonded structure 612 should have. In other words, this empirical data predicts the resultant die flatness.

Accordingly, at step 512 a target wafer bowing value corresponding to the desired die bowing value is retrieved from the database described above. At step 516 the measured amount of bowing is compared to the desired target wafer bowing value retrieved from the database. In one aspect, the measured amount may be considered acceptable if a difference between it and the desired target wafer bowing value is less than or equal to a predetermined value or percentage. Further, the predetermined value or percentage may be expressed as a range, for example, [−1.0% to +0.5%]. The acceptable range, as one of ordinary skill in the art would understand, is a design choice or could be empirically determined from the values in the database.

Figure 7:
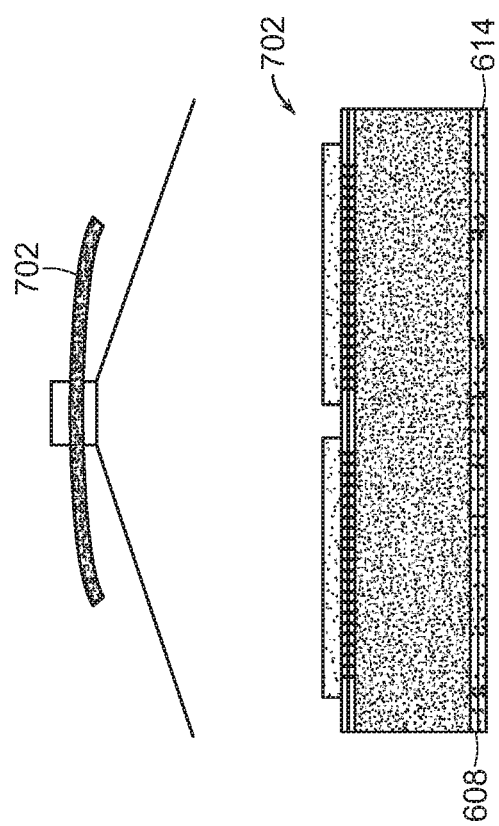
FIG. 7 represents a step in the processing of bonded wafers in accordance with the method of FIG. 5.

If the amount of bowing is not the desired amount, i.e., if bow compensation is needed, then control passes to step 520 where the database is again accessed to determine how much stress compensation is needed to provide the intermediate bonded structure 612 with the desired amount of bowing. The database may have information on the characteristics of a layer of material that could be applied to correct the bowing to the desired amount. This may be, for example, Nitride film to provide tensile force or an Oxide film to provide compressive force. The thickness of the film may be recorded in the database. The applied stress compensation could comprise both tension and compression applied in some pattern if, for example, the compensation layer was too much and the opposite film needed to be applied to correct the bow. At step 524, an additional compensation layer 614 is provided. It should be noted that the additional compensation layer 614 is provided on a surface, for example, an outer or external surface of the second wafer 603, where it will not be affected, i.e., changed or removed, by subsequent processing. As shown in FIGS. 6 and 7, the additional compensation layer 614 is provided on the second compensation layer 608. It should be noted that the second compensation layer 608 is implemented as part of the wafer bonding process while the additional compensation layer 614 is provided to achieve the desired wafer level bow prior to additional processing.

The amount of bowing is again measured at step 528 and control passes back to step 516 where the measured amount of bowing is compared to the target wafer bowing value. If the measured amount is still not at the target wafer bowing value, then another stress compensation layer is added as at step 524, for example, another stress compensation layer could be placed on the additional compensation layer 614 already in place, and the measuring process is repeated until the flatness value is met or it is determined that the bowing cannot be compensated for.

Once the measured amount of bowing is at the desired value, control passes from step 516 to step 532 where the subsequent wafer processing is performed. The subsequent processing at step 532 may add or remove layers or material, such as removing the first compensation layer 606, that then result in a change of the bowing of a bonded wafer 702, see FIG. 7. Advantageously, setting the bowing of the bonded wafer 702 in the process at step 516 accounts for any subsequent changes in the flatness or bowing of the device that may occur.

Figure 9:
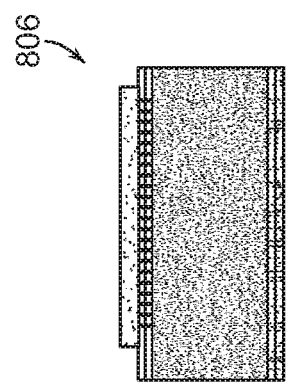
FIG. 9 represents a step in the processing of bonded wafers in accordance with the method of FIG. 5.
Figure 8:
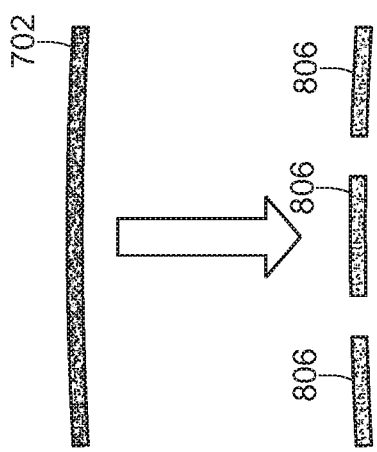
FIG. 8 represents a step in the processing of bonded wafers in accordance with the method of FIG. 5.

When the dicing process is implemented in step 532, see FIGS. 8 and 9, the singulated dies 806 have the desired amount of flatness. As shown in FIG. 8, the processed wafer pair structure 702 in the top portion progresses to the singulated dies 806 presented in the bottom portion. The flatness of the singulated die 806 is measured, using known metrology techniques and is expressed in micrometers (µm), at step 536 to confirm that the empirical data in the database is still applicable.

It should be noted that, where used, "top," "bottom," "upper," "lower," etc., are merely for explaining the relative placement of components described herein. These relative placement descriptions are not meant to limit the claims with respect to a direction of gravity or a horizon.

The present disclosure is illustratively described above in reference to the disclosed implementations. Various modifications and changes may be made to the disclosed implementations by persons skilled in the art without departing from the scope of the present disclosure as defined in the appended claims.

What is claimed is:

1. A method of manufacturing an individual die having a target die bowing value from a bonded wafer using a wafer bonding process, the method comprising:
   (a) bonding a first wafer to a second wafer to create an intermediate bonded structure;
   (b) measuring an amount of bowing of a first surface of the intermediate bonded structure;
   (b1) retrieving a target wafer bowing value from a database as a function of the target die bowing value, wherein the database comprises empirical data collected from other bonded wafers previously processed through the wafer bonding process, the collected data correlating a wafer bowing value with a die bowing value;
   (c) applying a bowing compensation layer of material to a second surface of the intermediate bonded structure if a difference between the measured bowing amount and the retrieved target bowing value is not less than or equal to a predetermined threshold value;
   (d) repeating (b) and (c) until the difference is less than or equal to the predetermined threshold value;
   (e) at least one of adding or removing a layer or adding or removing material to or from the first or second wafers of the intermediate bonded structure to obtain the bonded wafer; and
   (f) dicing the bonded wafer apart to obtain the individual die having the target die bowing value,
   wherein (c) applying the bowing compensation layer of material to the second surface of the intermediate bonded structure comprises:
      retrieving, from the database, an amount of bowing compensation necessary to modify the intermediate bonded structure to change the measured bowing amount to be within the predetermined threshold value of the target bowing value; and applying a subsequent bowing compensation layer of material corresponding to the necessary bowing compensation amount.

2. The method of claim 1, wherein applying a bowing compensation layer of material to the second surface of the intermediate bonded structure comprises:
applying one of: a film providing a tensile force or a film providing a compressive force.

3. The method of claim 1, wherein performing additional processing of the intermediate bonded structure to obtain the bonded wafer does not change a structure of the bowing compensation layer of material.

4. The method of claim 1, wherein applying the bowing compensation layer of material to a second surface of the intermediate bonded structure comprises applying a subsequent bowing compensation layer of material to a bowing compensation layer of material already provided on the second surface.

5. The method of claim 1, wherein the second surface of the intermediate bonded structure is an external surface of the intermediate bonded structure.

6. The method of claim 1, wherein measuring the amount of bowing of the first surface of the intermediate bonded structure is one of:
made after an annealing operation is performed;
made after a grinding operation is performed but before chemical or mechanical polishing/planarization (CMP); or
made after a detector thinning operation is performed.

7. A method of manufacturing an individual die, having a target die bowing value, from a bonded wafer using a wafer bonding process, the method comprising:
(a) bonding a first wafer to a second wafer to create an intermediate bonded structure;
(b) retrieving, from a database, a target wafer bowing range of values that corresponds to the target die bowing value, wherein the database comprises empirical data collected from other bonded wafers previously processed through the wafer bonding process, the collected data correlating a wafer bowing range of values with a die bowing value;
(c) measuring an amount of bowing of a first surface of the intermediate bonded structure;
(d) comparing the measured bowing amount to the retrieved target wafer bowing range of values;
(e) applying a bowing compensation layer of material to a second surface of the intermediate bonded structure if the measured bowing amount is not within the retrieved target bowing range of values;
(f) repeating (c)-(e) until the measured bowing amount is within the retrieved target bowing range of values;
(g) at least one of adding or removing a layer or adding or removing material to or from the first or second wafers of the intermediate bonded structure to obtain the bonded wafer; and
(h) dicing the bonded wafer apart to obtain the individual die having the target die bowing value,
wherein applying the bowing compensation layer of material to the second surface of the intermediate bonded structure comprises:
retrieving, from the database, an amount of bowing compensation necessary to modify the intermediate bonded structure to change the measured bowing amount to be within the retrieved target bowing range of values; and applying a subsequent bowing compensation layer of material corresponding to the necessary bowing compensation amount.

8. The method of claim 7, wherein performing additional processing of the intermediate bonded structure to obtain the bonded wafer does not change a structure of the bowing compensation layer of material.

9. The method of claim 7, wherein the second surface of the intermediate bonded structure is an external surface of the intermediate bonded structure.

10. The method of claim 7, wherein measuring the amount of bowing of the first surface of the intermediate bonded structure is one of:
made after an annealing operation is performed;
made after a grinding operation is performed but before chemical or mechanical polishing/planarization (CMP); or
made after a detector thinning operation is performed.

11. A method of manufacturing a plurality of dies, each die having a target die bowing value, the method comprising:
(a) bonding a first wafer to a second wafer to create an intermediate bonded wafer structure;
(b) measuring an amount of bowing of a first surface of the intermediate bonded wafer structure;
(b1) retrieving a target wafer bowing value from a database as a function of the target die bowing value, wherein the database comprises empirical data collected from other bonded wafers previously processed through the wafer bonding process, the collected data correlating a wafer bowing value with a die bowing value;
(c) applying a bowing compensation structure to a second surface of the intermediate bonded structure if a difference between the measured bowing amount and the retrieved target bowing value is not less than or equal to a predetermined threshold value;
(d) repeating (b) and (c) until the difference is less than or equal to the predetermined threshold value;
(e) at least one of adding or removing a layer or adding or removing material to or from the first or second wafers of the intermediate bonded structure to obtain a bonded wafer structure; and
(f) dicing the bonded wafer structure apart to obtain the plurality of individual dies, each die having the target die bowing value,
wherein applying the bowing compensation structure to the second surface of the intermediate bonded structure comprises:
retrieving, from the database, an amount of bowing compensation necessary to modify the intermediate bonded structure to change the measured bowing amount to be within the predetermined threshold value of the target bowing value; and
applying a subsequent bowing compensation layer of material corresponding to the necessary bowing compensation amount.

12. The method of claim 11, wherein applying the bowing compensation structure to the second surface of the intermediate bonded structure comprises:
applying one or more of: a film providing a tensile force or a film providing a compressive force.

13. The method of claim 11, wherein performing additional processing steps on the intermediate bonded structure to obtain the bonded wafer does not change the bowing compensation structure.

14. The method of claim 11, wherein the bowing compensation structure comprises a plurality of bowing compensation layers of material.

15. The method of claim 11, wherein measuring the amount of bowing of the first surface of the intermediate bonded structure is one of:
   made after an annealing operation is performed;
   made after a grinding operation is performed but before chemical or mechanical polishing/planarization (CMP); or
   made after a detector thinning operation is performed.

* * * * *